United States Patent
Yang et al.

(10) Patent No.: US 8,461,568 B2
(45) Date of Patent: Jun. 11, 2013

(54) RE-EMITTING SEMICONDUCTOR CONSTRUCTION WITH ENHANCED EXTRACTION EFFICIENCY

(75) Inventors: Zhaohui Yang, North Oaks, MN (US); Yasha Yi, New York, NY (US); Catherine A. Leatherdale, Woodbury, MN (US); Michael A. Haase, St. Paul, MN (US); Terry L. Smith, Roseville, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 13/264,924

(22) PCT Filed: Apr. 30, 2010

(86) PCT No.: PCT/US2010/033142
§ 371 (c)(1),
(2), (4) Date: Oct. 17, 2011

(87) PCT Pub. No.: WO2010/129412
PCT Pub. Date: Nov. 11, 2010

(65) Prior Publication Data
US 2012/0074381 A1   Mar. 29, 2012

Related U.S. Application Data

(60) Provisional application No. 61/175,640, filed on May 5, 2009.

(51) Int. Cl.
*H01L 33/00* (2010.01)
(52) U.S. Cl.
USPC ............... 257/13; 257/E33.008; 257/E33.073
(58) Field of Classification Search
CPC .................................. H01L 33/32; H01L 33/06
USPC ........................ 257/13, 98, E33.008, E33.073
See application file for complete search history.

(56) References Cited

U.S. PATENT DOCUMENTS

| 3,343,026 | A | 9/1967 | Luechinger |
| 6,610,598 | B2 * | 8/2003 | Chen ............................ 438/666 |

(Continued)

FOREIGN PATENT DOCUMENTS

| WO | WO 2008/020819 | 2/2008 |
| WO | WO 2008/109296 | 9/2008 |

(Continued)

OTHER PUBLICATIONS

Agui et al., "Invetigation on AlGaNP solar cells for current matched multijunction cells", 2003, 3rd World Conference on Photovoltaic Energy Conversion, pp. 670-671, May 2003.*

(Continued)

*Primary Examiner* — Nikolay Yushin
(74) *Attorney, Agent, or Firm* — Kristofor L. Storvick

(57) ABSTRACT

A stack of semiconductor layers forms a re-emitting semiconductor construction (RSC). The stack includes an active region that converts light at a first wavelength to light at a second wavelength, the active region including at least one potential well. The stack also includes an inactive region extending from an outer surface of the stack to the active region. Depressions are formed in the stack that extend from the outer surface into the inactive region. An average depression depth is at least 50% of a thickness of the inactive region or at least 50% of a nearest potential well distance. The depressions may have at least a 40% packing density in plan view. The depressions may also have a substantial portion of their projected surface area associated with obliquely inclined surfaces.

14 Claims, 7 Drawing Sheets

U.S. PATENT DOCUMENTS

| | | |
|---|---|---|
| 6,657,236 B1 | 12/2003 | Thibeault |
| 7,067,340 B1 * | 6/2006 | Tsai et al. .................. 438/47 |
| 7,126,160 B2 | 10/2006 | Sun |
| 7,361,938 B2 | 4/2008 | Mueller |
| 7,402,831 B2 | 7/2008 | Miller |
| 2005/0110033 A1 | 5/2005 | Heremans |
| 2005/0274967 A1 | 12/2005 | Martin |
| 2005/0280013 A1 | 12/2005 | Sun |
| 2006/0001056 A1 | 1/2006 | Saxler |
| 2007/0221867 A1 | 9/2007 | Beeson |
| 2007/0284565 A1 | 12/2007 | Leatherdale |
| 2007/0290190 A1 | 12/2007 | Haase |
| 2008/0149916 A1 | 6/2008 | Baba |
| 2008/0173887 A1 | 7/2008 | Baba |
| 2008/0217639 A1 | 9/2008 | Kim |
| 2010/0117997 A1 * | 5/2010 | Haase ...................... 345/204 |

FOREIGN PATENT DOCUMENTS

| | | |
|---|---|---|
| WO | WO 2009/048704 | 4/2009 |
| WO | WO 2009/148717 | 12/2009 |
| WO | WO 2009/158191 | 12/2009 |
| WO | WO 2009/158138 | 7/2010 |
| WO | WO 2010/129409 | 11/2010 |
| WO | WO 2010/129464 | 11/2010 |
| WO | WO 2011/002686 | 1/2011 |
| WO | WO 2011/008474 | 1/2011 |

OTHER PUBLICATIONS

Moser et al., "Refraction index of (AlxGa1-x)0.5In0.5P grown by metalorganic vapor phase epitaxy", 1994, Applied Physics Letters, vol. 64, No. 2, pp. 235-237, Jan. 1994.*

Bao et al., "Improvement of surface light extraction from flip-chip GaN-based LED by embossing of thermosetting polymers", Physics Status Solidi, (c) 4, No. 1, pp. 33-36, © Wiley Inter Science, 2007.

Cuong et al., "Enhanced light output from aligned micropit InGaN-based light emitting diodes using wet-etch sapphire patterning", Applied Physics Letters vol. 90, No. 13, pp. 131107-1 to 131107-3, © 2007.

Huh et al., "Improved light-output and electrical performance of InGaN-based light-emitting diode by microroughening of the p-GaN surface", Journal of Applied Physics, vol. 93, No. 11, pp. 9383-9385, Jun. 1, 2003.

Raguin, Daniel H. and Morris, G. Michael, "Analysis of antireflection-structured surfaces with continuous one-dimensional surface profiles", Applied Optics, vol. 32, No. 14, pp. 2582-2598, May 10, 1993.

Search Report for International Application No. PCT/US2010/033142, 5 pages, Date of Mailing Aug. 20, 2010.

Written Opinion for International Application No. PCT/US2010/033142, 8 pages, Date of Mailing Aug. 20, 2010.

* cited by examiner

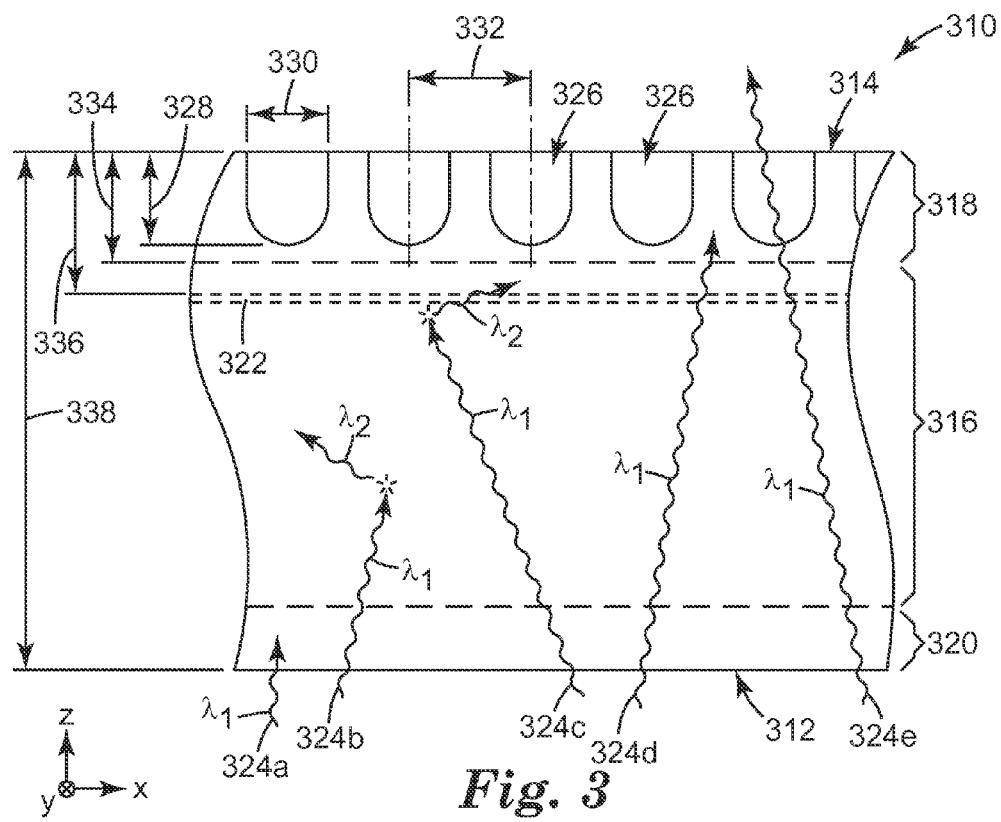
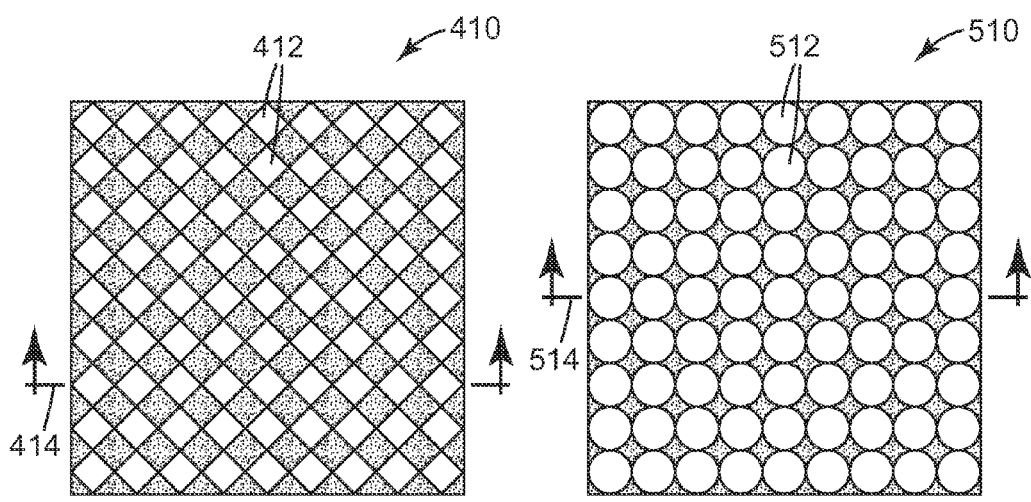

RE-EMITTING SEMICONDUCTOR CONSTRUCTION WITH ENHANCED EXTRACTION EFFICIENCY

CROSS REFERENCE TO RELATED APPLICATIONS

This application is a national stage filing under 35 U.S.C. 371 of PCT/US2010/033142, filed on Apr. 30, 2010, which claims priority to U.S. Provisional Application No. 61/175,640, filed on May 5, 2009, the disclosure of which is incorporated by reference in its/their entirety herein.

RELATED APPLICATIONS

This application is related to the following U.S. Patent Applications, filed on even date herewith and which are incorporated by reference: U.S. application Ser. No. 61/175,636, "Re-Emitting Semiconductor Carrier Devices For Use With LEDs and Methods of Manufacture", and U.S. application Ser. No. 61/175,632, "Semiconductor Devices Grown on Indium-Containing Substrates Utilizing Indium Depletion Mechanisms".

FIELD OF THE INVENTION

This invention relates generally to solid state semiconductor light sources and related devices, systems, and methods.

BACKGROUND

A wide variety of semiconductor devices, and methods of making semiconductor devices, are known. Some of these devices are designed to emit light, such as visible or near-visible (e.g. ultraviolet or near infrared) light. Examples include light emitting diodes (LEDs) and laser diodes. Another example is a stack of semiconductor layers that forms a re-emitting semiconductor construction (RSC).

Unlike an LED, an RSC does not require an electrical drive current from an external electronic circuit in order to emit light. Instead, the RSC generates electron-hole pairs by absorption of light at a first wavelength $\lambda_1$ in an active region of the RSC. These electrons and holes then recombine in potential wells in the active region to emit light at a second wavelength $\lambda_2$ different from the first wavelength $\lambda_1$, and optionally at still other wavelengths $\lambda_3$, $\lambda_4$, and so forth depending on the number of potential wells and their design features. The initiating radiation or "pump light" at the first wavelength $\lambda_1$ is typically provided by a blue, violet, or ultraviolet emitting LED coupled to the RSC. Exemplary RSC devices, methods of their construction, and related devices and methods can be found in, e.g., U.S. Pat. No. 7,402,831 (Miller et al.), U.S. Patent Application Publications US 2007/0284565 (Leatherdale et al.) and US 2007/0290190 (Haase et al.), PCT Publication WO 2009/048704 (Kelley et al.), and pending U.S. application Ser. No. 61/075,918, "Semiconductor Light Converting Construction", filed Jun. 26, 2008, all of which are incorporated herein by reference.

FIG. 1 shows an illustrative device 100 that combines an RSC 108 and an LED 102. The LED has a stack of LED semiconductor layers 104, sometimes referred to as epilayers, on an LED substrate 106. The layers 104 may include p- and n-type junction layers, light emitting layers (typically containing quantum wells), buffer layers, and superstrate layers. The layers 104 may be attached to the LED substrate 106 via an optional bonding layer 116. The LED has an upper surface 112 and a lower surface, and the upper surface is textured to increase extraction of light from the LED compared to the case where the upper surface is flat. Electrodes 118, 120 may be provided on these upper and lower surfaces, as shown. When connected to a suitable power source through these electrodes, the LED emits light at a first wavelength $\lambda_1$, which may correspond to blue or ultraviolet (UV) light. Some of this LED light enters the RSC 108 and is absorbed there.

The RSC 108 is attached to the upper surface 112 of the LED via a bonding layer 110. The RSC has upper and lower surfaces 122, 124, with pump light from the LED entering through the lower surface 124. The RSC also includes a quantum well structure 114 engineered so that the band gap in portions of the structure is selected so that at least some of the pump light emitted by the LED 102 is absorbed. The charge carriers generated by absorption of the pump light move into other portions of the structure having a smaller band gap, the quantum well layers, where the carriers recombine and generate light at the longer wavelength. This is depicted in FIG. 1 by the re-emitted light at the second wavelength $\lambda_2$ originating from within the RSC 108 and exiting the RSC to provide output light.

FIG. 2 shows an illustrative semiconductor layer stack 210 comprising an RSC. The stack was grown using molecular beam epitaxy (MBE) on an indium phosphide (InP) wafer. A GaInAs buffer layer was first grown by MBE on the InP substrate to prepare the surface for II-VI growth. The wafer was then moved through an ultra-high vacuum transfer system to another MBE chamber for growth of II-VI epitaxial layers used in the RSC. Details of the as-grown RSC are shown in FIG. 2 and summarized in Table 1. The table lists the thickness, material composition, band gap, and layer description for the different layers associated with the RSC. The RSC included eight CdZnSe quantum wells 230, each having a transition energy of 2.15 eV. Each quantum well 230 was sandwiched between CdMgZnSe absorber layers 232 having a band gap energy of 2.48 eV that could absorb blue light emitted by an LED. The RSC also included various window, buffer, and grading layers.

TABLE 1

| Reference No. | Material | Thickness (nm) | Band Gap/Transition (eV) | Comment |
|---|---|---|---|---|
| 230 | $Cd_{0.48}Zn_{0.52}Se$ | 3.1 | 2.15 | quantum well |
| 232 | $Cd_{0.38}Mg_{0.21}Zn_{0.41}Se$ | 8 | 2.48 | absorber |
| 234 | $Cd_{0.38}Mg_{0.21}Zn_{0.41}Se:Cl$ | 92 | 2.48 | absorber |
| 236 | $Cd_{0.22}Mg_{0.45}Zn_{0.33}Se$ | 100 | 2.93 | window |
| 238 | $Cd_{0.22}Mg_{0.45}Zn_{0.33}Se \rightarrow Cd_{0.38}Mg_{0.21}Zn_{0.41}Se$ | 250 | 2.93-2.48 | grading |
| 240 | $Cd_{0.38}Mg_{0.21}Zn_{0.41}Se:Cl$ | 46 | 2.48 | absorber |
| 242 | $Cd_{0.38}Mg_{0.21}Zn_{0.41}Se \rightarrow Cd_{0.22}Mg_{0.45}Zn_{0.33}Se$ | 250 | 2.48-2.93 | grading |
| 244 | $Cd_{0.39}Zn_{0.61}Se$ | 4.4 | 2.24 | II-VI buffer |
| 246 | $Ga_{0.47}In_{0.53}As$ | 190 | 0.77 | III-V buffer |

Further details of this and other RSC devices can be found in PCT Publication WO 2009/048704 (Kelley et al.).

Since the layers of the RSC are composed of semiconductor materials, and semiconductor materials typically have relatively high refractive indices, light at the second wavelength $\lambda_2$, and any other light generated within the RSC, is susceptible to becoming trapped inside the RSC by total internal reflection at outer surfaces thereof, and to being absorbed within the RSC instead of contributing to the emitted output. Therefore, to reduce this loss mechanism, surface texturing of one or more surfaces of the RSC to enhance extraction efficiency of long wavelength light generated within the RSC has been proposed. See e.g. PCT Publication WO 2009/048704 (Kelley et al.).

BRIEF SUMMARY

We describe herein devices and methods that advance the state of the art of light extraction for re-emitting semiconductor constructions (RSCs) in particular. Thus, beyond simply texturing one or more surfaces of the RSC, we disclose herein specific design details for extraction features that are particularly well suited for application to RSCs.

Some of the disclosed design details relate to specific features or characteristics of an RSC. For example, in some cases it may be important to distinguish between an active region and an inactive region of the RSC, in order to specify a relationship of those regions to the extraction features. In some cases it may be important to identify a characteristic of the RSC referred to below as a nearest potential well distance, in order to specify a relationship between that parameter and the extraction features. In some cases it may be important to identify still other characteristics of the RSC for purposes of specifying advantageous extraction features for use with RSCs.

The present application therefore discloses, inter alia, a device that includes a stack of semiconductor layers. The stack includes an active region and a first inactive region. The active region includes at least a first potential well, and is adapted to convert light at a first wavelength $\lambda_1$ to light at a second wavelength $\lambda_2$. The first inactive region extends from an outer surface of the stack to the active region, and is characterized in that light at the first wavelength $\lambda_1$ propagating therein is not substantially converted to other light. A distance from the outer surface of the stack to the active region corresponds to a thickness of the first inactive region. The stack also includes a plurality of depressions formed therein that extend from the outer surface into the first inactive region, the depressions being characterized by an average depression depth, and wherein the average depression depth is at least 50% of the thickness of the first inactive region.

Also disclosed is a device that includes a stack of semiconductor layers. The stack includes an active region and a first inactive region. The active region includes at least a first potential well, and is adapted to convert light at a first wavelength $\lambda_1$ to light at a second wavelength $\lambda_2$. The first inactive region extends from an outer surface of the stack to the active region, and is characterized in that light at the first wavelength $\lambda_1$ propagating therein is not substantially converted to other light. The first potential well is a nearest potential well to the outer surface of the stack and is characterized by a nearest potential well distance from the outer surface of the stack to the first potential well. The stack also includes a plurality of depressions formed therein that extend from the outer surface into the first inactive region, the depressions being characterized by an average depression depth, and wherein the average depression depth is at least 50% of the nearest potential well distance.

Also disclosed is a multilayer semiconductor construction that includes a stack of semiconductor layers configured to absorb light at a first wavelength and emit light at a longer second wavelength. The stack includes a potential well, a first semiconductor layer, and a second semiconductor layer. The first semiconductor layer absorbs light at the first wavelength and has an index of refraction $n_1$. The second semiconductor layer has an index of refraction $n_2$ and includes a plurality of extraction structures for extracting light from the stack at the second wavelength. The refractive index $n_2$ is equal to or greater than $n_1$.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

FIG. 3 is a schematic sectional view of a generalized semiconductor layer stack that includes an RSC, in which various design parameters relevant to extraction feature design are identified;

FIGS. 4 and 5 are plan views of exemplary extraction feature patterns;

In the figures, like reference numerals designate like elements.

DETAILED DESCRIPTION OF ILLUSTRATIVE EMBODIMENTS

Figure 1:
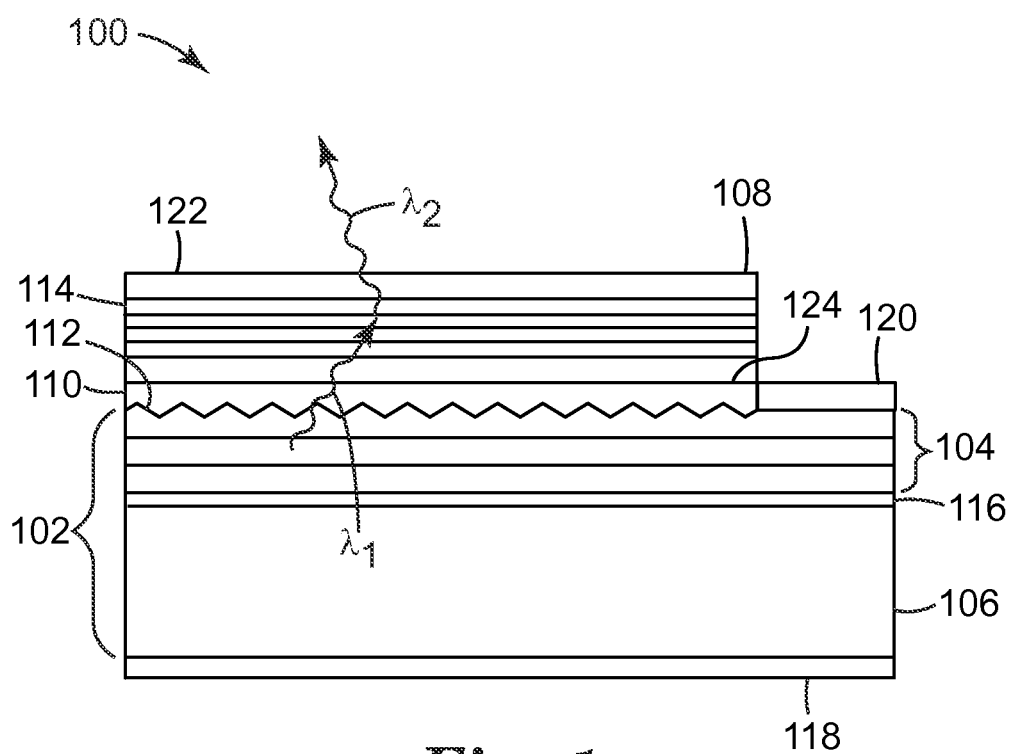
FIG. 1 is a schematic side view of a combination LED/RSC device.
Figure 2:
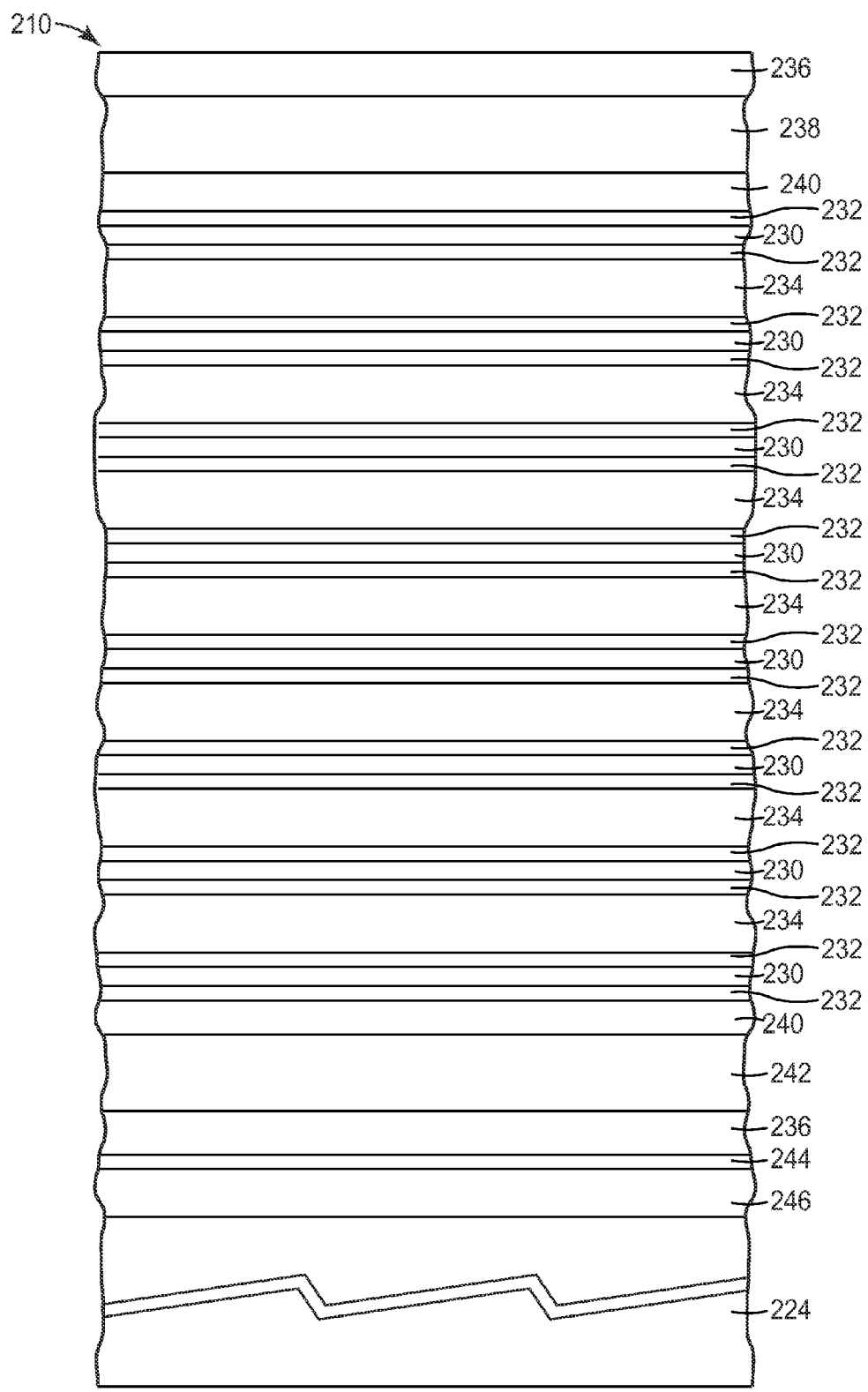
FIG. 2 is a schematic side view of a particular semiconductor layer stack that includes an RSC.

Turning now to FIG. 3, we see there a schematic sectional view of a generalized semiconductor layer stack 310 that includes or constitutes an RSC, and in which various design parameters relevant to extraction feature design are identified. Note that individual layers of the stack 310, such as are shown in the device of FIG. 2, are not included in the schematic drawing of FIG. 3 for ease of description and for generality. The stack 310 may be engineered for use with a pump light source such as the LED 102 of FIG. 1, or another electroluminescent device such as a laser diode, or or with any other suitable light source. If used with an LED, it may be bonded to the LED as depicted for example in FIG. 1, or it may be separated from the LED and coupled thereto with a lens, light guide, or other suitable means so as to receive the pump light.

Typically, the stack is nominally flat and planar from a macroscopic point of view, thus a Cartesian x-y-z coordinate system is included in the figure such that the z-axis is perpendicular to the plane of the stack. The z-axis may represent the growth direction of the stack, i.e., the direction along which growth of the constituent layers occurred during stack fabrication. In that event, a first outer surface 312 of the stack can be referred to as a "starting surface", and the opposed second outer surface 314 of the stack can be referred to as an "ending surface" of the stack. Alternatively, the growth direction of the stack may be in the negative z-direction. In that case, the first outer surface 312 is referred to as the "ending surface" and the second outer surface 314 is referred to as the "starting surface" of the stack. "Starting surface" and "ending surface", and related terms such as "starting" layer and "ending" layer, are descriptive of the chronological growth order of the stack. Note that in cases where a first-grown semiconductor layer is etched away at a later time for some design purpose, the second-grown semiconductor layer is considered to be the starting layer, and the outer surface of the second-grown layer is considered to be the starting surface of the stack. Similarly, if a last-grown semiconductor layer is etched away at a later time, the second-to-last-grown semiconductor layer is considered to be the ending layer of the stack, and the outer surface of this layer is considered to be the ending surface of the stack.

The lateral boundaries of the stack 310 are shown in wavy lines to indicate the stack may extend laterally along the x-y plane.

The stack 310 can be considered to be made up of at least two regions: an active region 316 and a first inactive region 318. In the embodiment of FIG. 3, the stack 310 also includes a second inactive region 320. The active region includes at least a first potential well 322, and is adapted to convert light at a first wavelength $\lambda_1$ to light at a second wavelength $\lambda_2$, corresponding to the transition energy of the potential well. The active layer may also include one or more absorbing layers closely adjacent to the potential well, having a band gap energy larger than the transition energy of the potential well. The first inactive region 318 extends from outer surface 314 of the stack to the active region 316, and is characterized in that light at the first wavelength $\lambda_1$ propagating therein is not substantially converted to other light. The second inactive region 320 is similar to the first inactive region, except that it extends from the outer surface 312 to the active region 316. Five exemplary rays of pump light at the first wavelength $\lambda_1$ are illustrated entering the stack at outer surface 312, which may be referred to as the "illumination surface" of the stack because it faces towards the pump light source. A first ray 324a is absorbed in the second inactive region 320, but does not result in any substantial re-emission of light. Second and third rays 324b, 324c are absorbed in the active region 316, and each produces re-emitted light at the second wavelength $\lambda_2$ (or at other re-emitted wavelengths). Fourth ray 324d is absorbed in the first inactive region 318 and does not result in any substantial re-emission of light. Fifth ray 324e is not absorbed by any part of the stack 310, and exits the stack through an extraction feature at the outer surface 314.

Note that the boundaries of the active and inactive regions may or may not coincide with physical boundaries or interfaces between distinct layers of the stack 310. For example, if a uniform semiconductor layer that absorbs pump light is disposed adjacent a potential well and has a thickness substantially greater than the diffusion length of the charge carriers for the semiconductor material, then a portion of that layer proximate the potential well, e.g., the portion within one or two minority carrier diffusion lengths of the boundary of the potential well, may be considered to be part of the active region, and the remainder of the layer, which is more remote from the potential well, may be considered to be part of the inactive region. Pump light that is absorbed in the proximate portion of the layer produces electron-hole pairs, and they are able to migrate to the potential well to produce radiative re-emission. Pump light that is absorbed in the remote portion of the layer may also produce electron-hole pairs, but they are more likely to recombine non-radiatively than carriers in potential wells, and thus do not produce significant re-emission.

Thus, for example, if an RSC contains a main layer group that includes a plurality of potential wells separated by semiconductor absorption layers, with a "starting" potential well at one side and an "ending" potential well at an opposite side of the main layer group, the RSC also including thick semiconductor absorption layers disposed at both of these sides of the main layer group, then the active region may correspond to, for example, (1) the combination of the main layer group and portions of the thick absorption layers that are within one minority carrier diffusion length of the boundary of the main layer group, or (2) the combination of the main layer group and portions of the thick absorption layers that are within two minority carrier diffusion lengths of the boundary of the main layer group, for example.

Refractive indices of the different layers or regions of the semiconductor layer stack may also be of significance. In some cases it may be desirable for the inactive region to have a refractive index $n_2$, as measured for example at the pump wavelength or at a re-emission wavelength, that is equal to or greater than a refractive index $n_1$ of the active region, so that light generated within the active region is not prevented from entering the inactive region by total internal reflection (TIR). Further, the stack may be designed such that for any layer in the stack disposed between a first layer of index $n_1$ in the active region and a second layer of index $n_2$ in the inactive region, the refractive index of such layer is no greater than $n_2$ so as to avoid TIR.

Furthermore, in some embodiments, the layer stack may include a carrier barrier layer disposed between a first layer of index $n_1$ in the active region and a second layer of index $n_2$ in the inactive region. Carrier barrier layers are discussed more fully in pending U.S. application Ser. No. 61/075,918, "Semiconductor Light Converting Construction", filed Jun. 26, 2008, and incorporated herein by reference. The carrier barrier layer preferably has a higher band gap energy than at least that of the second layer, to prevent charge carriers from migrating into the inactive layer and combining non-radiatively. However, materials with increased band gap often have a decreased refractive index, and thus if the refractive index of the carrier barrier is less than $n_1$, then it is preferably made to be optically thin, e.g., thinner than the total internal reflection evanescent field penetration depth, to avoid TIR of re-emitted light in the first layer.

Returning to FIG. 3, the stack 310 includes a plurality of extraction features in the form of depressions 326 provided in the outer surface 314. The depressions 326 may be arranged in a regular repeating pattern or in a non-repeating or random arrangement. The depressions may be further characterized by a depression depth 328, aperture size 330, and spacing or pitch 332. In cases where the depressions exhibit substantial variability in any of these parameters from one depression to another, averages of the pertinent parameter(s) can be used. In the case of regular arrays, these parameters may all be the same or substantially the same for each depression. One advantage of uniformity in depression design may be the ability to more consistently achieve optimal performance. For example, if the depressions are to be formed using wet etching techniques, variations in aperture size may produce corresponding variations in depression depth. Such depth variations may place a practical limit on the maximum achievable average depression depth, particularly if it is desired that no depression have a depth greater than a given value, such as the thickness of the inactive region. Of course, even if the designer wishes to make the depressions nominally the same, whether in depth, aperture size, shape, or the like, normal process-related non-uniformities or defects, whether of an etchant solution, or of the material being etched, or of environmental conditions, will inevitably introduce some finite variation of the parameters when measured over the entire population of depressions, or some significant subset thereof.

Although FIG. 3 shows extraction features formed in the inactive region 318 but not in inactive region 320, in other embodiments the extraction features can be formed in the region 320 but not region 318, or extraction features can be formed in both inactive regions 318, 320, i.e., on both sides of the semiconductor stack 310.

Another significant design aspect of the extraction features is the shape, profile, or contour of the features. The depressions 326, for example, are illustrated with generally curved or U-shaped terminuses. A substantial portion of the surface of each of these depressions is made up of surfaces that are inclined at an oblique angle relative to the x-y plane, for example. This is particularly true if one considers the projected areas, or plan view, of the depressions, e.g. when viewing the stack from above (referring to FIG. 3) along the negative z-direction. Other extraction designs utilize other shapes. Some designs, for example, may have more or less proportional surface area that is obliquely inclined, or for example, inclined in a range from 10 to 80 degrees, relative to the x-y plane. Designs having only vertical side walls and flat, horizontal terminuses may have substantially no surface area inclined obliquely to the x-y plane.

Yet another design parameter we have studied is the pattern of the extraction features. Some patterns may be random, while others may be highly regular and uniform. Highly regular patterns can be used to produce nanostructures known as photonic crystals if the pitch between extraction features is sufficiently small. Photonic crystals can be used to modify the density of states for emission, and also to control the angular distribution of light emitted by the device. In general for photonic crystals, the pitch of the hole pattern A is approximately equal to the emission wavelength in the material, $\lambda_2/n$. For visible emitters, patterns of holes with a pitch<200 nm, and diameters on the order of 100 nm, are used for effective results. Fabrication of such features normally calls for electron beam lithography, nanoimprint lithography, or other highly advanced patterning techniques. In contrast, we have found that pitches substantially larger than the emission wavelength in the material $\lambda_2/n$, or larger than the emitted wavelength in air $\lambda_2$, to be effective in increasing the extraction efficiency from the RSC. In some cases, the pitch can be at least 1, 2, 3, 4, or 5 times the emitted wavelength in air $\lambda_2$. The relatively large feature size can be patterned using conventional contact or proximity photolithography tools.

Patterns of depressions can also be characterized by packing density. The packing density may be defined by the percent area occupied by the plurality of depressions when the outer surface is viewed from above, i.e., in plan view.

Our investigations have also shown that certain design parameters of the semiconductor stack may be relevant to optimally designed extraction features. These parameters include a thickness 334 of the inactive region in which the depressions are formed, and a nearest potential well distance 336. The nearest potential well distance 336 is a distance from the outer surface 314 of the stack to the nearest potential well to the outer surface, which in the case of FIG. 3 is deemed to be the potential well 322. (Note that the nearest potential well distance is referenced to a particular outer surface of the stack, and thus if extraction features are formed in both sides of the stack, for example, then the nearest potential well distance for one surface or side of the stack will typically be different than the nearest potential well distance for another surface or side of the stack.) Another characteristic distance of the stack 310 is also shown in FIG. 3: the stack thickness 338 measured between the stack outer surfaces 312, 314. In general, thinner structures are desirable due to reduced cost, and stronger interaction of the waveguide modes with the extraction features, but these effects can be counterbalanced by mechanical handling difficulties and possible lifetime effects. In some embodiments, the depression depth 328 may be on the order of 50% of the stack thickness 338, so as to disrupt as many slab waveguiding modes as possible without penetrating the active region, or the potential wells of the active region.

As part of our investigations we performed electromagnetic simulations to help identify optimal light extraction design features for RSCs. Finite difference time domain (FDTD) simulations were used for the optical modeling. The FDTD simulation method takes into account all relevant optical characteristics including polarization and coherence effects, thus providing a reliable design tool for RSC optical performance.

The basic RSC device structure shown in the embodiment of FIG. 3 was used as a modeling archetype. In particular, the model assumed an RSC or layer stack having a top inactive region of variable thickness T (see thickness 334 in FIG. 3) and refractive index 2.646, a central active region of thickness 600 nm and refractive index 2.646, and a bottom inactive region of thickness 500 nm and refractive index 2.45. Of course, "top" and "bottom" in this context is only for purposes of identification and does not imply any particular orientation with respect to gravity. The refractive indices and other material characteristics used in the model were based on typical refractive indices for CdMgZnSe materials, which are suitable for use in RSCs. The top inactive region was modeled to be exposed to air (refractive index 1.0) and the bottom inactive region was modeled to be exposed to a medium of refractive index 1.5, which is typical of a bonding material that may be used to bond the RSC to an LED, for example. Both inactive regions, as well as the air and bonding material media, were assumed to have no absorption of light.

The pitch Λ (see dimension 332 in FIG. 3), aperture size ApS (see dimension 330 in FIG. 3), depression depth DD (see dimension 328 in FIG. 3), inactive region thickness T (see dimension 334 in FIG. 3), as well as the depression profile and the depression pattern were initially selected as parameters for investigation. The model assumed pump light was injected from an extended source in the refractive index 1.5 bonding material, and calculated the amount of re-emitted light collected at a position in air above the stack. The model thus characterized the performance of the RSC or layer stack in terms of the device's extraction efficiency. The extraction efficiency, as reported in connection with the simulation or modeling results herein (see e.g. Tables 2-5 below), is calculated as the ratio of the electromagnetic flux of re-emitted light (e.g. of wavelength $\lambda_2$) emitted from the output side of the stack (see e.g. surface 314 of FIG. 3) divided by the electromagnetic flux of re-emitted light (e.g. of wavelength $\lambda_2$) that is generated within the potential wells of the active region, unless otherwise noted.

In one series of models, we investigated the effect of changing the pitch Λ, the aperture size ApS, and the inactive region thickness T. These models assumed the extraction features were identical depressions having the depression pattern 410 shown in plan view in FIG. 4. The individual depressions in plan view are indicated by reference numeral 412. This pattern has a packing ratio of about 50%. The cross-sectional profile of the depressions through cut line 414 is shown in the modeled RSC 610 of FIG. 6. This RSC has a first inactive region 612, an active region 614, and a second inactive region 616. The exterior surfaces of the RSC are surface 612a and surface 616a. Surface 612a has depressions 620 formed therein which, in this series of models, correspond to the depressions 412 of FIG. 4. The depressions 620 have generally U-shaped terminuses with curved side walls as shown.

Such curved features may be obtainable with known wet etching techniques. Surface 616a is exposed to bonding material 618. The thicknesses and refractive indices assumed for the various layers are as described above.

The results for this series of models are provided in Table 2. In the table, in addition to the extraction efficiency, an "improvement factor" is also shown. This improvement factor is a ratio of the extraction efficiency for the particular device modeled divided by the extraction efficiency for the identical device but with no extraction features, i.e., no depressions formed in the outer surface of the inactive region 612. Thus, an improvement factor of 2, for example, means that the embodiment with the extraction features had two times the extraction efficiency (100% more) compared to that of the embodiment with no extraction features.

TABLE 2

| Λ (μm) | DD (μm) | T (μm) | DD/T (%) | Ext. Effic. (%) | Improvement Factor |
|---|---|---|---|---|---|
| 2.8 | 0.93 | 0.93 | 100 | 44.3 | 2.6 |
| 2.8 | 1.4 | 1.4 | 100 | 48.9 | 2.9 |
| 2.8 | 0.93 | 1.93 | 48 | 30.0 | 1.8 |
| 2.8 | 1.4 | 2.4 | 58 | 33.4 | 2.0 |
| 0.7 | 0.23 | 0.23 | 100 | 38.4 | 2.34 |
| 0.7 | 0.35 | 0.35 | 100 | 43.8 | 2.7 |
| 0.7 | 0.23 | 1.23 | 19 | 28.2 | 1.72 |
| 0.7 | 0.35 | 1.35 | 26 | 31.7 | 1.93 |

Note that the aperture size ApS for each of these embodiments scales with the pitch value Λ. For Λ=2.8 μm, ApS=2 μm, and for Λ=0.7 μm, ApS=0.5 μm. This data indicates that the extraction efficiency can be increased by increasing the etch depth or depression depth DD relative to the inactive region thickness T. For example, a ratio of at least 50, 60, 70, 80, or 90% may be desirable. The depression depth may also be substantially 100% of the inactive region thickness. If the depression depth is increased further, the depressions will begin to remove or displace material in the adjoining active region 614. From the standpoint of maximizing extraction efficiency, removing significant amounts of material from the active region, e.g., removing portions of a potential well, may be undesirable. Thus, the depression depth or average depression depth in at least some cases is preferably is no more than 100% of the inactive region thickness.

In many practical embodiments, a nearest potential well, e.g., a potential well in the active region 614 that lies nearest inactive region 612, lies relatively close to the inactive region. Therefore, based on the above results, it may also be desirable to maintain a ratio of depression depth DD to nearest potential well distance (in FIG. 6, the distance from surface 612a to the nearest potential well in region 614) to at least 50, 60, 70, 80, or 90%, and preferably no more than 100%.

As an alternative to (or in addition to) characterizing the extraction features in terms of the ratio of a depression depth to the inactive region thickness, or in terms of the ratio of the depression depth to the nearest potential well distance, the extraction features may instead (or also) be characterized by the distance (or average distance, whether averaged over the entire population of depressions or some significant subset thereof) from the bottom or terminus of the depressions to the boundary of the inactive region, or to the boundary of the nearest potential well. Any one of, or all of, these distances, so characterized, are preferably less than 750 nm, or less than 500 nm, or less than 250 nm, or less than 100 nm.

In some cases, light propagation within the RSC can be approximated as light propagation within a slab waveguide. Depending on the relative refractive indices of the active region and the inactive region(s), or portions thereof, waveguiding may be confined to the entire thickness of the RSC, or only to some fraction of that thickness. The depth of the depressions may be selected so as to disrupt as much of the planar waveguide (represented, for example, by a high refractive index portion of the stack) as possible without detrimentally impacting light re-generation in the active region. Thus, for example, the depressions or other extraction features described herein may be formed in an inactive region having an inactive region thickness that is greater than 50% of the overall thickness of the stack or RSC. In some embodiments, however, the overall thickness of the stack may include an inactive region of relatively low refractive index, which does not effectively form part of the waveguide within the RSC. In such cases, extraction features may be provided in a second inactive region of higher refractive index which does effectively form part of the waveguide, and the second inactive region has a thickness greater than the thickness of the active region.

In another series of models, we investigated the effect of the cross-sectional shape or profile of the extraction features. This modeling again assumed the same pattern 410 of depressions, but the cross-sectional profile of the depressions through cut line 414 was now changed to the modeled RSC 710 of FIG. 7. This RSC is the same as RSC 610 of FIG. 6, hence the same reference numerals are used for many of the constituent elements, except that the inactive region 612 is replaced with inactive region 712. This region 712 has an outer surface 712a in which identical depressions 720 are formed, the depressions 720 now corresponding to the depressions 412 of FIG. 4. In contrast to the curved surface depressions 620, the depressions 720 have generally rectangular-shaped terminuses, with substantially no curved side walls and no obliquely disposed surfaces, as shown. The rectangular-shaped profiles of FIG. 7 may be achievable with certain dry etching processes. The thicknesses and refractive indices assumed for the various layers are again as described above.

The results for this series of models are provided in Table 3.

TABLE 3

| Λ (μm) | DD (μm) | T (μm) | DD/T (%) | Depression profile | Ext. Effic. (%) | Improvement Factor |
|---|---|---|---|---|---|---|
| 2.8 | 1.4 | 1.4 | 100 | FIG. 6 | 48.9 | 2.9 |
| 2.8 | 1.4 | 1.4 | 100 | FIG. 7 | 35.1 | 2.1 |

Note again that the aperture size ApS scales with the pitch value Λ as before. This data indicates that curved surfaces, and/or obliquely inclined surfaces, can help to increase the extraction efficiency. Preferably, a substantial portion of the surface of the extraction feature is curved or obliquely inclined. For example, for a given projected area of a given depression in plan view, at least 20%, or at least 40%, 60%, or 80% of the area preferably corresponds to surfaces that are curved or are inclined at oblique angles relative to the plane of the layer stack. Further, this percentage of area may preferably correspond to surfaces that are inclined at oblique angles in a range from 10 to 80 degrees, for example.

In many common etching processes, it is easier to fabricate depressions having rounded plan-view shapes or apertures than those having segmented shapes such as squares or rectangles. Therefore, we also investigated the effect of different plan-view extraction feature shapes. In a further series of models, we compared the depression pattern 410, containing depressions with square- or diamond-shaped apertures, with the depression pattern 510 shown in FIG. 5. In pattern 510, the individual depressions 512 have a circular aperture. Note that this change in aperture shape, for the selected circle diameter (ApS was selected to be nominally equal to Λ), also changes the packing ratio. Pattern 510 has a packing ratio as defined previously of about 79%.

Figure 6:
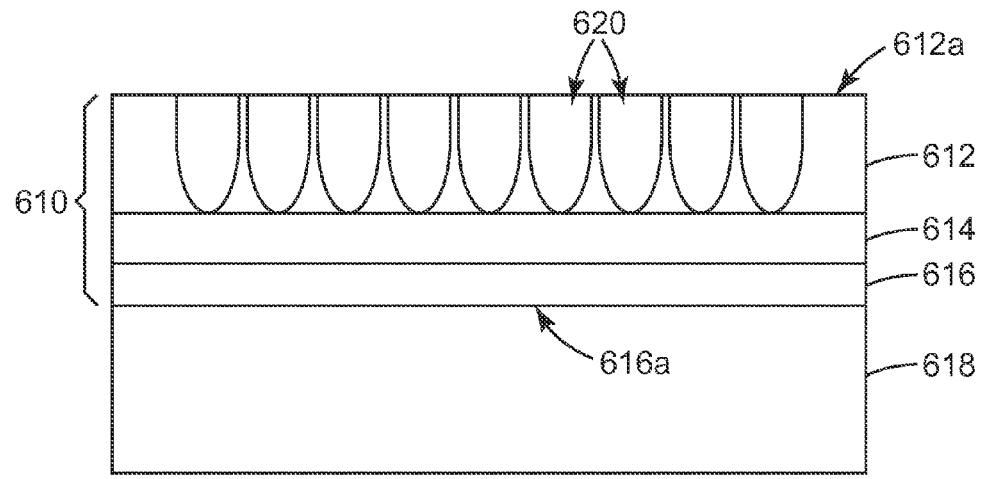
FIGS. 6-9 are schematic sectional views of modeled extraction feature designs.

For this series of models, we compared the embodiment described above that combines the square-aperture pattern of FIG. 4 with the U-shaped depression profile of FIG. 6, referred to here as a first embodiment, with a similar embodiment that combines the circular-aperture pattern of FIG. 5 with a U-shaped depression profile substantially similar to FIG. 6, referred to here as a second embodiment. Thus, the depressions used in the second embodiment exhibited a cross-sectional profile along cut line 514 (FIG. 5) that was similar to the U-shaped profile shown in FIG. 6, with a lateral scaling factor adjustment made for the changed ratio of ApS/Λ.

The results for this series of models are provided in Table 4.

TABLE 4

| Λ (μm) | DD (μm) | T (μm) | DD/T (%) | Depression pattern | Ext. Effic. (%) | Improvement Factor |
|---|---|---|---|---|---|---|
| 2.8 | 1.4 | 1.4 | 100 | FIG. 4 | 48.9 | 2.9 |
| 2.8 | 1.4 | 1.4 | 100 | FIG. 5 | 45.2 | 2.8 |

We observe that the second embodiment, with it circular apertures, provides a slightly lower extraction efficiency than the first embodiment, with its square apertures.

Figure 7:
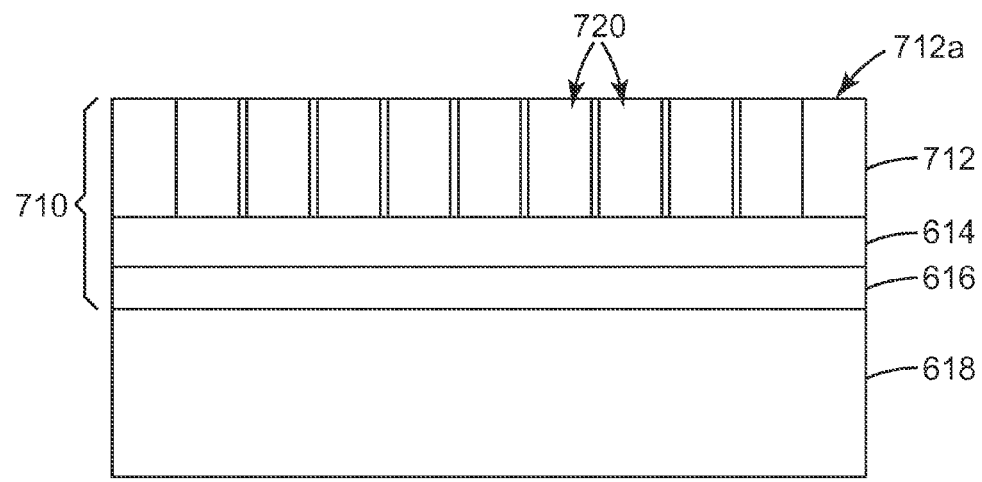
Figure 8:
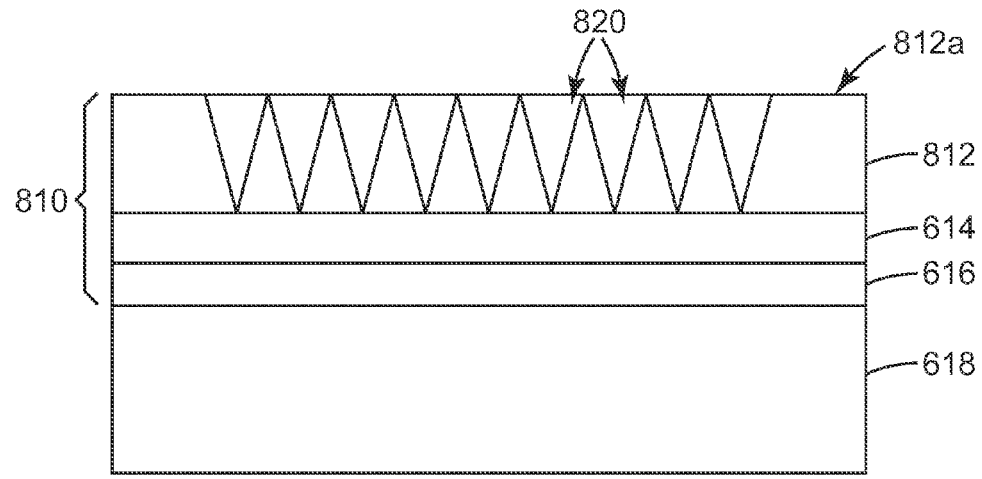
Figure 9:
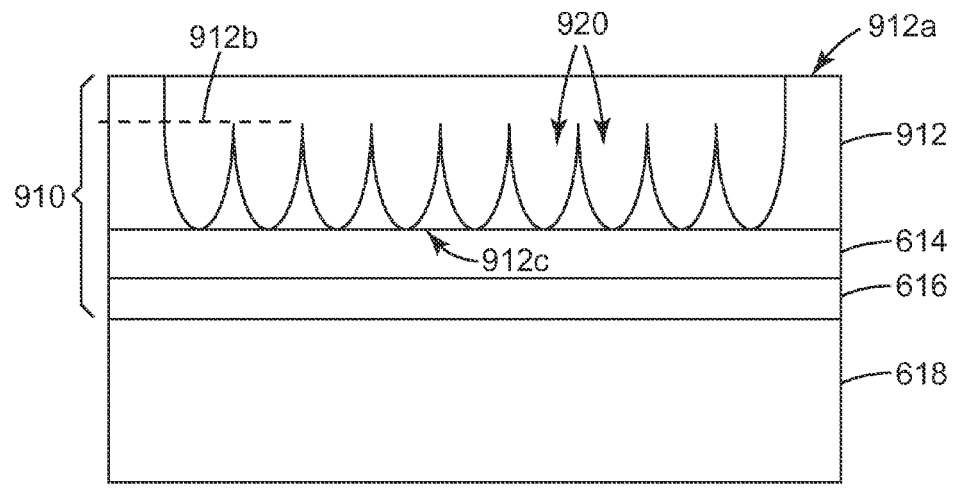

In still another series of models, we performed further investigation into different cross-sectional shapes or profiles of the extraction features. This modeling again assumed the depression pattern 410 of FIG. 4 with its square-shaped apertures. We compared three embodiments: a first embodiment, in which the cross-section through cut line 414 is depicted in FIG. 7 (rectangular-shaped profile); a second embodiment, in which the cross-section through cut line 414 is depicted in FIG. 8 (V-shaped profile); and a third embodiment, in which the cross-section through cut line 414 is depicted in FIG. 9 (U-shaped profile with over-etch). The RSC 810 of FIG. 8 is the same as RSC 610 of FIG. 6, hence the same reference numerals are used for many of the constituent elements, except that the inactive region 612 is replaced with inactive region 812. This region 812 has an outer surface 812a in which identical depressions 820 are formed. In contrast to the curved surface depressions 620, the depressions 820 have generally V-shaped terminuses, with substantially no curved side walls but with side surfaces that are substantially entirely obliquely disposed, as shown. The V-shaped profiles of FIG. 8 may be achievable using selective etchants, i.e. etchants having different etch rates for different crystalline directions, or using gray scale lithography techniques.

We contemplate the use of any of a wide variety of photolithographic techniques, or combinations thereof, to form the extraction features disclosed herein. Contact lithography, interference lithography, projection lithography, imprint lithography, and patterning based on self-assembled particles to serve either as an exposure mask or as the photoresist, are but a few examples.

The RSC 910 of FIG. 9 is also the same as RSC 610 of FIG. 6, with the same reference numerals being used for many of the constituent elements, except that again the inactive region 612 is replaced, this time with inactive region 912. This region 912 has an outer surface 912a in which identical depressions 920 are formed. The depressions 920 have curved, generally U-shaped terminuses similar to those of depressions 620. However, the depressions 920 have been made, for example, with an etchant solution that has completely removed an upper portion of region 912 between adjacent depressions, at least from the perspective of the cross-sectional view shown in FIG. 9.

Results for this series of models are provided in Table 5.

TABLE 5

| Λ (μm) | DD (μm) | T (μm) | DD/T (%) | Depression profile | Ext. Effic. (%) | Improvement Factor |
|---|---|---|---|---|---|---|
| 2.8 | 1.4 | 1.4 | 100 | FIG. 7 | 31.0 | 1.9 |
| 2.8 | 1.4 | 1.4 | 100 | FIG. 8 | 42.6 | 2.6 |
| 2.8 | 1.4 | 1.4 | 100 | FIG. 9 | 45.2 | 2.8 |

Figure 9A:
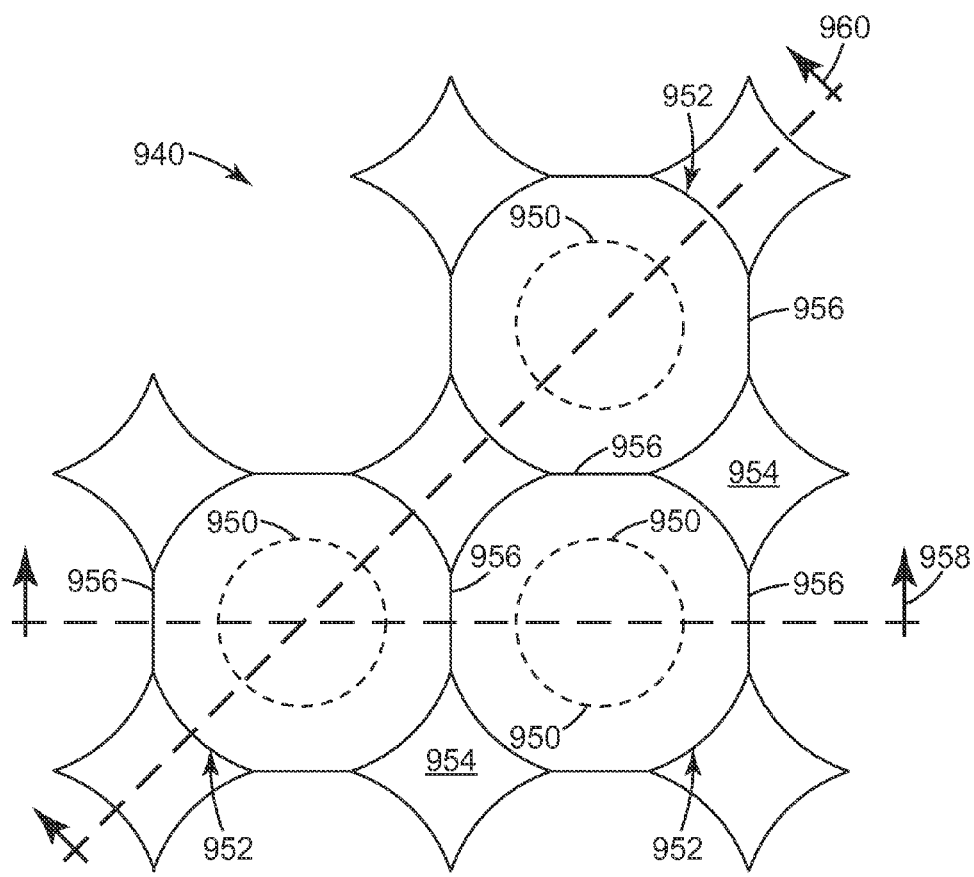
FIG. 9a is a plan view of an exemplary structured surface containing extraction features.

An interesting aspect of the structured surface of FIG. 9 is the reduced height 912b of the knife-edge-shaped structures between adjacent depressions in region 912, from the perspective of the cross-sectional view of FIG. 9. Note that in other cross-sectional views, such a reduction in height between depressions 920 may or may not be present. Depending on the nature of the three-dimensional structure that is formed, it may be appropriate to consider the knife-edge-shaped protrusions residing at the reduced height 912b as the outer surface of the inactive region 912. Reference is made, for example, to the extraction surface 940 shown in plan view in FIG. 9a. The surface 940 was formed by etching through a mask having a pattern of circular apertures 950 provided on a flat outer surface. Etching proceeds into the surface through the apertures until the depressions 952, which have roughly circular aperture shapes in plan view, are formed. Posts of material 954, whose upper surfaces coincide with the original flat outer surface before etching, remain in place as shown. When viewing the structured surface in cross-section along cut-line 958, knife-edge-shaped structures 956 between adjacent depressions will be observed. However, when viewing the structured surface in cross-section along cut-line 960, no such knife-edge-shaped structures are observed, and posts 954 with flat tops coinciding with the original flat outer surface will instead be observed.

Fabricated Examples

We have fabricated RSC devices with extraction structures formed by depressions with obliquely inclined side walls. The RSC device was made using molecular beam epitaxy (MBE) growth techniques using CdMgZnSe and similar II-VI semiconductor materials grown on a III-V (InP) wafer substrate. The RSC included at least one potential well disposed in an active region, and an inactive region. The inactive region substantially corresponded to a relatively thick (on the order of 1 micron) II-VI window layer, the exterior surface of which formed an exterior surface of the RSC.

"Extraction efficiency" that is reported in connection with the fabricated examples herein, is calculated as the ratio of the electromagnetic flux of re-emitted light (e.g. of wavelength $\lambda_2$) emitted from the output side of the stack (see e.g. surface 314 of FIG. 3) divided by the electromagnetic flux of pump light (e.g. of wavelength $\lambda_1$) that is absorbed by the stack, unless otherwise noted.

Standard photolithography was first utilized to define the checkerboard pattern on this exterior surface of the RSC. Following the photolithography process, wet chemical etching was applied to transfer the photoresist pattern into the RSC, and to create a etched depressions with graded-depth profiles (U-shaped terminuses). The selection of the etchant chemistry and process was important. A perfect isotropic etch produces depressions with rounded side walls. A perfect anisotropic etch produces depressions with straight side walls; the side walls are vertical if the anisotropic etch only attacks the exposed surface parallel to the wafer (stack) plane. Wet chemical etchants may produce either isotropic or anisotropic etching; potential benefits of anisotropic etching or a combination of both isotropic and anisotropic etching can also be explored.

In this example, isotropic wet chemical etching was used. We have found that concentrated HBr or HBr solution are good candidates for etching CdMgZnSe. To address the issue of etch rate variation with material composition, a small quantity of $Br_2$ was added to the etching solution for faster etching and better etching control. A digital representation of an extraction surface 1010 of etched depressions 1012 produced by this approach is illustrated in the perspective view of FIG. 10. The depressions 1012 were etched in the outer surface 1014 by immersing a CdMgZnSe RSC device into $H_2O$:HBr:$Br_2$=120:20:1 solution for 150 seconds at room temperature without agitation. After etching, the sample was stripped of photoresist, and the surface was then characterized with atomic force microscopy (AFM). The surface was characterized by scanning with the AFT along the two paths 1016, 1018 shown in FIG. 10. Trace 1110 in FIG. 11 shows the measured relative vertical position or height in nanometers as a function of scan position along the horizontal axis corresponding to path 1016. Trace 1210 in FIG. 12 is similar to that of FIG. 11, but for scan path 1018. As is evident in FIGS. 10-12, the etched depressions have a side-wall profile similar to that of the simulated extraction structure.

Figure 10:
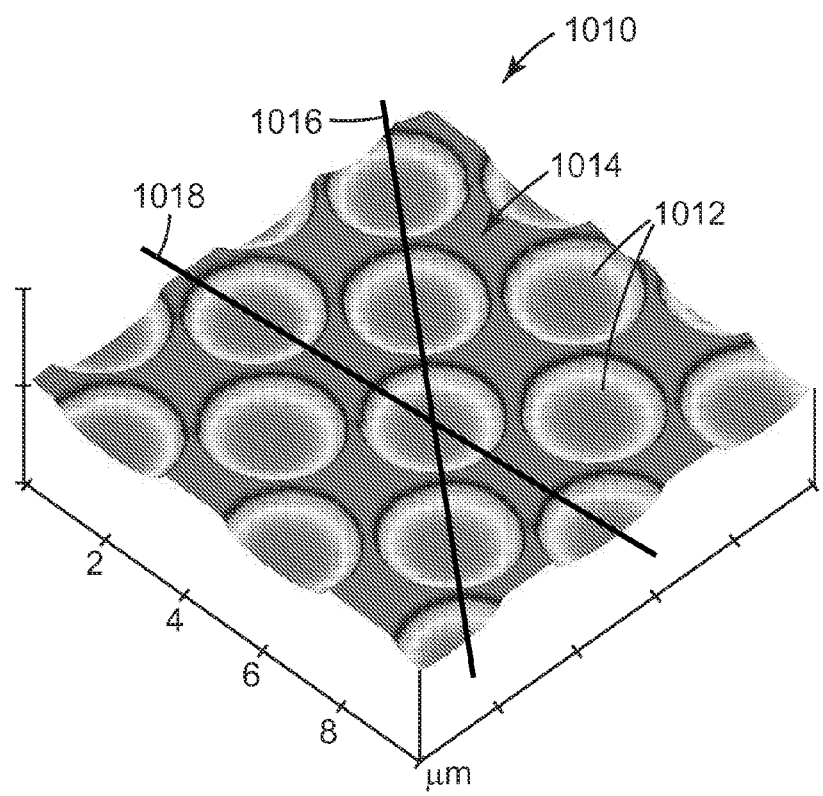
FIG. 10 is a perspective representation of an experimentally implemented extraction structure.
Figure 11:
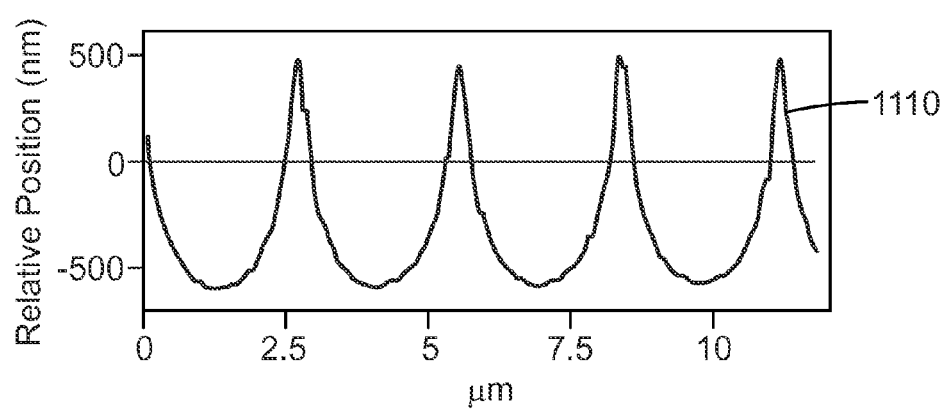
FIGS. 11 and 12 are measured depth profiles for the structure of FIG. 10 along the paths indicated in FIG. 10.
Figure 12:
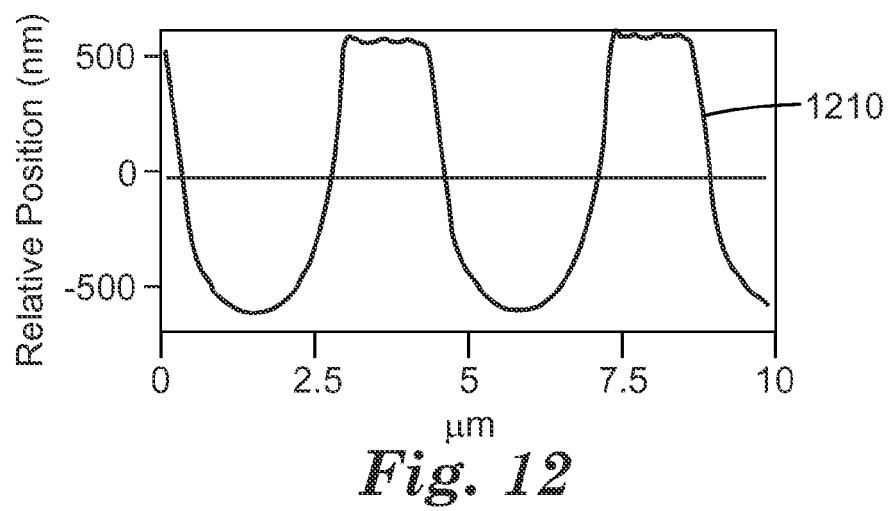

Compared to RSC samples without extraction features, RSC samples made with the extraction pattern with curved side walls of FIGS. 10-12 exhibited a three-fold improvement of the wavelength conversion efficiency, and up to 50% extraction efficiency has been observed. In an alternative embodiment, the depressions may be etched to have square-shaped plan view apertures rather than the rounded apertures of FIG. 10. To achieve this in the presence of undercutting by the etching solution, the pattern used in the photoresist mask can be "predistorted" to produce a more ideal etched structure. For example, square patterns with serifs at the corners may be utilized.

Additional RSC devices were fabricated to incorporate extraction features. These RSC devices combined the semiconductor layer stack of the RSC with a carrier window in the absence of the growth substrate of the RSC, which structures are referred to as "RSC carrier devices" and described more fully in commonly filed U.S. application Ser. No. 61/175,636, "Re-Emitting Semiconductor Carrier Devices For Use With LEDs and Methods of Manufacture". Such RSC carrier devices in platelet form were fabricated from II-VI epitaxial layers grown by molecular beam epitaxy on a III-V semiconductor substrate in wafer form. The nominal epitaxial layers (including the InP substrate and GaInAs buffer layer) are listed in Table 6 below. The layer arrangement of the RSC was designed for the inverted orientation configuration discussed above, wherein the starting surface of the RSC is designed to be the illumination surface of the RSC, through which pump light enters the RSC. This can be seen, for example, by virtue of the placement of the cyan blocker layer (growth sequence #15) between the active area of the RSC (the layers of growth sequence #5-13) and the ending surface of the RSC (the exterior surface of the cyan blocker layer).

TABLE 6

| Growth sequence | Composition | Thickness (nm) | Band gap/ Transition wavelength | Comment |
| --- | --- | --- | --- | --- |
| 15 | CdMgZnSe:Cl | 2000 | 500 | Cyan blocker |
| 14 | CdMgZnSe:Cl | 79.5 | 480 --> 500 | Grading layer |
| 13 | CdMgZnSe:Cl | 58.9 | 480 | Absorbing layer |
| 12 | CdZnSe | 2.4 | 573 | Quantum well |
| 11 | CdMgZnSe:Cl | 117.8 | 480 | Absorbing layer |
| 10 | CdZnSe | 2.4 | 573 | Quantum well |
| 9 | CdMgZnSe:Cl | 117.8 | 480 | Absorbing layer |
| 8 | CdZnSe | 2.4 | 573 | Quantum well |
| 7 | CdMgZnSe:Cl | 117.8 | 480 | Absorbing layer |
| 6 | CdZnSe | 2.4 | 573 | Quantum well |
| 5 | CdMgZnSe:Cl | 58.9 | 480 | Absorbing layer |
| 4 | CdMgZnSe:Cl | 250 | 415 --> 480 | Grading layer |
| 3 | CdMgZnSe | 1000 | 415 | Window layer |
| 2 | CdZnSe | 3.2 | 551 | II-VI buffer layer |
| 1 | GaInAs | 200 | | III-V buffer layer |
| | InP | (very large) | | III-V base layer |

Figure 13:
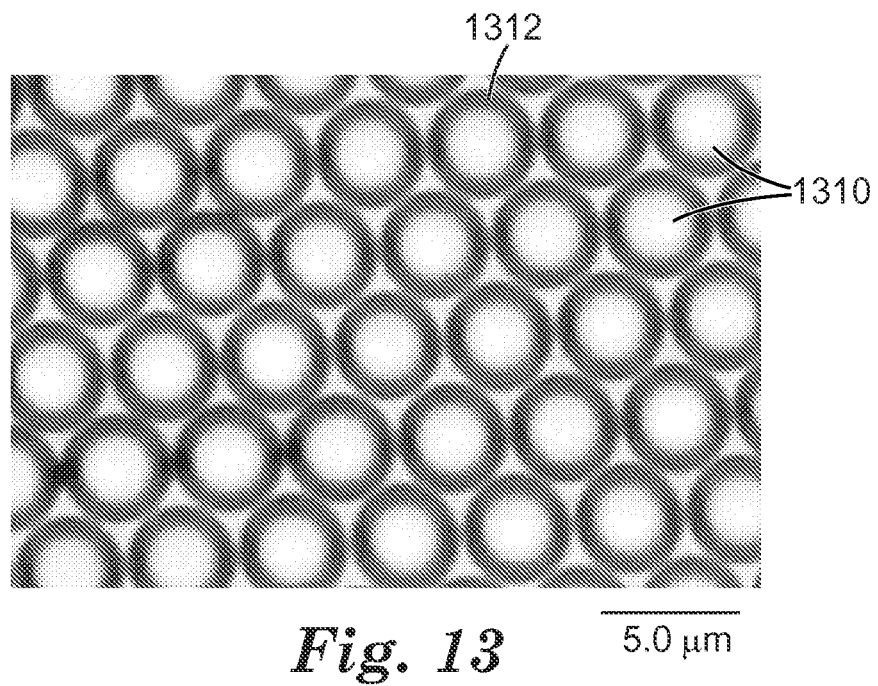
FIG. 13 is a grayscale representation of an optical micrograph of an extraction structure that was fabricated in an RSC.

The II-VI layer stack (growth sequence 2-15) forms an RSC that has 4 potential wells. After growing these layers on the III-V substrate, light extraction features, in the form of a regular array or pattern of depressions or pits, were etched into the exposed major surface of the RSC, i.e., the ending surface of the cyan blocker layer. The pit pattern was achieved with conventional contact photolithography and wet etching. Futurrex PR1-1000A photoresist was patterned to make apertures or openings of approximately 2 μm diameter, and arranged in a hexagonal pattern with a center-to-center spacing of 4 μm. The exposed surface of the RSC was etched in a solution of 100 ml $H_2O$:20 ml HBr:1 ml $Br_2$ (by volume) for about 40 seconds. Because of undercutting, this resulted in etch pits or depressions that were approximately hemispherical with a radius of about 2 μm. A grayscale representation of an optical micrograph of this extraction structure is shown in FIG. 13. In the figure, the depressions 1310 are clearly seen to have circular-shaped plan view apertures, and the lateral dimensions of the structures can be determined with the 5.0 micron scale provided. The dark rings 1312 in the figure are an artifact of the lighting arrangement used.

After removal of the photoresist, the textured side of the construction, i.e., the ending surface of the RSC, was bonded to a glass microscope slide cover which served as a carrier window, using Norland 83H thermally-cured adhesive (Norland Products, Cranbury, N.J.), and cured on a 120° C. hotplate. The slide cover was substantially transparent to all visible light, and had a thickness of about 167 microns and lateral dimensions of 25 mm×25 mm. In comparison, the growth substrate wafer and RSC had lateral dimensions of 20 mm×20 mm. To prevent flexing, the slide cover was reinforced by attaching one side of it to a microscope slide using a wax, before attaching the other side of the slide cover to the RSC/substrate wafer. The InP base layer was removed by brief mechanical lapping, followed by etching in a solution of 3:1 HCl:$H_2O$. The etchant stopped at the GaInAs buffer layer (growth sequence #1). This buffer layer was then removed in an agitated solution of 30 ml ammonium hydroxide (30% by weight), 5 ml hydrogen peroxide (30% by weight), 40 g adipic acid, and 200 ml water, leaving only the II-VI RSC (layers #2-15 of the growth sequence) attached to the microscope slide cover and to the reinforcing microscope slide. The exposed, thin CdZnSe layer (layer 2), which has lower band gap than the window layer, and which thus would absorb light at the pump wavelength, was also removed by a short plasma etch in argon, using an inductively-coupled plasma reactiveion etching (ICP-RIE) system (Oxford Instruments). Etching conditions include ~85 sec @ 100 W RF power. Alternatively, this layer can be removed by wet etchant techniques suitable for etching II-VI compounds—including HBr:H2O:Br2 or Br2:methanol.

The microscope slide was then removed from the construction, so that all that remained was the II-VI layer stack constituting the RSC, attached to the slide cover, forming an RSC carrier device that could be handled in the laboratory without breakage and without damage to the RSC. Mechanical dicing was then used to cut the RSC carrier device into platelet format. A Disco dicing saw with 20 μm diamond blade was used to cut the sample into 1 mm×1 mm squares. The effectiveness of these platelets was tested by bonding them to Lumileds Rebel flip chip LEDs. A tiny drop of Sylgard 184 thermal-cure silicone purchased from Dow Corning, Midland, Mich., was dispensed onto a given LED, and an RSC carrier device platelet was then bonded to the LED in a die bonder. The bonded sample was cured at 125° C. for 10 minutes. Optical measurements indicated that majority of the blue LED pump light was converted into green (re-emitted) light, and very little of the blue pump light escaped through the bonding adhesive.

Although the example above is based on II-VI semiconductor RSC layers, other types of RSC layers, including those made entirely from III-V semiconductors, are also contemplated.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A device, comprising:
 a stack of semiconductor layers, the stack including:
  an active region adapted to convert light at a first wavelength $\lambda_1$ to light at a second wavelength $\lambda_2$, the active region including at least a first potential well; and
  a first inactive region extending from an outer surface of the stack to the active region, a distance from the outer surface to the active region corresponding to a thickness of the first inactive region, the first inactive region characterized in that light at the first wavelength $\lambda_1$ propagating therein is not substantially converted to other light;
 wherein the stack also includes a plurality of depressions formed therein that extend from the outer surface into the first inactive region, the depressions being characterized by an average depression depth, and wherein the average depression depth is at least 50% of the thickness of the first inactive region, wherein the active region of the semiconductor layer stack also includes a first absorbing layer closely adjacent to, and having a band gap energy greater than a transition energy of the first potential well.

2. A multilayer semiconductor construction, comprising:
 a stack of semiconductor layers configured to absorb light at a first wavelength and emit light at a longer second wavelength, the stack including:
  a potential well;
  a first semiconductor layer absorbing light at the first wavelength and having an index of refraction $n_1$; and
  a second semiconductor layer having an index of refraction $n_2$ and comprising a plurality of extraction structures for extracting light from the stack at the second wavelength;
 wherein $n_2$ is equal to or greater than $n_1$,
 wherein the potential well and the first semiconductor layer are part of an active region of the stack in which light at the first wavelength is converted to light at the second wavelength, the stack also having an inactive region characterized in that light at the first wavelength propagating therein is not substantially converted to light, the inactive region including the second semiconductor layer and having an inactive region thickness; and
 wherein the plurality of extraction structures comprise a plurality of depressions characterized by an average depression depth, and wherein the average depression depth is at least 50% of the inactive region thickness.

3. A device, comprising:
 a stack of semiconductor layers, the stack including:
  an active region adapted to convert light at a first wavelength $\lambda_1$ to light at a second wavelength $\lambda_2$, the active region including at least a first potential well; and
  a first inactive region extending from an outer surface of the stack to the active region, the first inactive region characterized in that light at the first wavelength $\lambda_1$ propagating therein is not substantially converted to other light;
 wherein the first potential well is a nearest potential well to the outer surface of the stack and is characterized by a nearest potential well distance from the outer surface to the first potential well; and
 wherein the stack also includes a plurality of depressions formed therein that extend from the outer surface into the first inactive region, the depressions being characterized by an average depression depth, and wherein the average depression depth is at least 50% of the nearest potential well distance.

4. The device of claim 3, wherein the depressions have nominally the same depth.

5. The device of claim 3, wherein the plurality of depressions have a packing density of at least 40%, the packing density being a percent area occupied by the plurality of depressions when the outer surface is shown in plan view.

6. The device of claim 3 in combination with an electroluminescent device configured to emit light at the first wavelength $\lambda_1$.

7. The device of claim 3, wherein the average depression depth is at least 60% of the nearest potential well distance.

8. The device of claim 7, wherein the average depression depth is at least 70% of the nearest potential well distance.

9. The device of claim 8, wherein the average depression depth is at least 80% of the nearest potential well distance.

10. The device of claim 9, wherein the average depression depth is at least 90% of the nearest potential well distance.

11. The device of claim 3, wherein the depressions do not substantially extend into the active region.

12. The device of claim 3, wherein the stack extends in lateral directions generally parallel to a reference plane, and wherein each depression includes a surface that is inclined at an oblique angle to the reference plane.

13. The device of claim 12, wherein each depression has a projected area in plan view, and wherein at least 20% of the projected area corresponds to surfaces that are inclined at oblique angles.

14. The device of claim 13, wherein at least 20% of the projected area corresponds to surfaces that are inclined at oblique angles in a range from 10 degrees to 80 degrees.

\* \* \* \* \*